United States Patent
Lin et al.

(10) Patent No.: US 12,293,952 B2
(45) Date of Patent: *May 6, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Ho-Chuan Lin, Taichung (TW); Min-Han Chuang, Taichung (TW); Chia-Chu Lai, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/659,692

(22) Filed: May 9, 2024

(65) Prior Publication Data
US 2024/0290675 A1 Aug. 29, 2024

Related U.S. Application Data

(60) Continuation of application No. 18/215,113, filed on Jun. 27, 2023, now Pat. No. 12,014,967, which is a (Continued)

(30) Foreign Application Priority Data

May 4, 2021 (TW) .................. 110116024

(51) Int. Cl.
*H01L 23/31* (2006.01)
*H01L 21/56* (2006.01)
(Continued)

(52) U.S. Cl.
CPC .......... *H01L 23/3107* (2013.01); *H01L 21/56* (2013.01); *H01L 23/5286* (2013.01);
(Continued)

(58) Field of Classification Search
CPC .................. H01L 24/14; H01L 24/16; H01L 2225/06513; H01L 21/56; H01L 23/3107;
(Continued)

(56) References Cited

U.S. PATENT DOCUMENTS 6,683,385 B2 1/2004 Tsai et al.
7,842,948 B2 11/2010 Schieck et al.
(Continued)

*Primary Examiner* — Didarul A Mazumder
(74) *Attorney, Agent, or Firm* — Studebaker Brackett PLLC

(57) ABSTRACT

An electronic package is provided, in which an electronic component with a conductive layer on an outer surface thereof is embedded in an encapsulant, where at least one electrode pad is disposed on an active surface of the electronic component, and at least one wire electrically connected to the electrode pad is arranged inside the electronic component, so that the conductive layer is electrically connected to the wire, such that the electrode pad, the wire and the conductive layer are used as a power transmission structure which serves as a current path to reduce DC resistance and improve an impedance issue associated with the supply of power.

10 Claims, 8 Drawing Sheets

Related U.S. Application Data division of application No. 17/368,475, filed on Jul. 6, 2021, now Pat. No. 11,728,234.

(51) Int. Cl.
*H01L 23/00* (2006.01)
*H01L 23/528* (2006.01)

(52) U.S. Cl.
CPC .............. *H01L 24/11* (2013.01); *H01L 24/14* (2013.01); *H01L 24/43* (2013.01); *H01L 24/45* (2013.01)

(58) Field of Classification Search
CPC ....... H01L 25/0652; H01L 2924/18161; H01L 24/19; H01L 24/45
USPC .......................................... 257/737; 438/613
See application file for complete search history.

(56) References Cited

U.S. PATENT DOCUMENTS

| | | | |
|---|---|---|---|
| 12,014,967 B2* | 6/2024 | Lin | H01L 23/3107 |
| 2008/0174031 A1 | 7/2008 | Lin et al. | |
| 2010/0270688 A1 | 10/2010 | Su et al. | |
| 2011/0037169 A1* | 2/2011 | Pagaila | H01L 25/0657 |
| | | | 257/E21.705 |
| 2012/0161316 A1 | 6/2012 | Gonzalez et al. | |
| 2014/0015130 A1 | 1/2014 | Eng et al. | |
| 2014/0332976 A1 | 11/2014 | Chen et al. | |
| 2017/0011993 A1 | 1/2017 | Zhao et al. | |
| 2020/0006232 A1 | 1/2020 | Pietambaram et al. | |

* cited by examiner

ELECTRONIC PACKAGE AND MANUFACTURING METHOD THEREOF

CROSS-REFERENCE TO RELATED APPLICATIONS

This is a Continuation of co-pending U.S. Ser. No. 18/215,113, filed Jun. 27, 2023, which is a divisional of U.S. Ser. No. 17/368,475, filed Jul. 6, 2021, which issued as U.S. Pat. No. 11,728,234 on Aug. 15, 2023. This application claims priority to Taiwan Application Serial No. 110116024, filed on May 4, 2021. The entirety of the above-mentioned patent application is hereby incorporated by reference herein and made a part of this specification.

BACKGROUND

1. Technical Field

The present disclosure relates to a semiconductor packaging process, and more particularly, to an electronic package capable of supplying power and a manufacturing method thereof.

2. Description of Related Art

In order to ensure the continuing miniaturization and multi-functionalities of electronic products and communication equipment, semiconductor packages need to be downscaled to facilitate the connections of multiple pins as well as high speed operations and high functionalities. For example, in advanced process packaging, the common types of packaging include 2.5D packaging process, Fan-Out Embedded Bridge (FO-EB), etc. Compared to 2.5D packaging process, FO-EB has the advantages of lower costs and a greater number of material suppliers.

FIG. 1-1 is a cross-sectional schematic view of a semiconductor package 1 of a conventional FO-EB. The semiconductor package 1 includes a first semiconductor chip 11 and a plurality of conductive pillars 13 disposed on a substrate structure 10 having a circuit layer 101. The first semiconductor chip 11 and the conductive pillars 13 are then covered by an encapsulant 15. A routing structure 16 that is electrically connected to the first semiconductor chip 11 and the conductive pillars 13 is then formed on the encapsulant 15. A plurality of second semiconductor chips 14 electrically connected to the routing structure 16 are disposed on the routing structure 16. The second semiconductor chips 14 are then encapsulated by an encapsulation layer 18, wherein the circuit layer 101 and the routing structure 16 adopt the standard for a fan-out redistribution layer (RDL). The first semiconductor chip 11 acts as a bridge component embedded in the encapsulant 15 for electrically bridging two adjacent second semiconductor chips 14.

In the conventional semiconductor package 1, the substrate structure 10 is disposed onto a circuit board 1a via a plurality of solder balls 12, and the conductive pillars 13 are electrically connected with the circuit layer 101, wherein some of the conductive pillars 13 can be used in conjunction with the circuit layer 101 and the routing structure 16 as an electrical transmission structure, such that power required by the second semiconductor chips 14 that are distant from the circuit board 1a can be provided by the circuit board 1a through the circuit layer 101 and the conductive pillars 13.

However, in the conventional semiconductor package 1, for electronic components positioned above the routing structure 16, the closer the electronic components are to the center of the first semiconductor chip 11, the greater the direct current (DC) resistance created, and poorer the ability for supplying power. In other words, power transmission paths are too long, such that the impedance is increased (such as an impedance curve L2 shown in FIG. 2F-1). As a result, some of electronic components above the routing structure 16 may not have enough power or even have power outages. For example, for a second semiconductor chip 14 on the right-hand side of and above the routing structure 16, a power supply contact 17 of the second semiconductor chip 14 is positioned on top of a contact 110 at the center of the first semiconductor chip 11. Power has to be transmitted from a power supply port of the circuit board 1a to the power supply contact 17 via the circuit layer 101, a conductive pillar 13 on the right-hand side of FIG. 1-1, and the routing structure 16. This power transmission path is very long, creating a large impedance that increases the likelihood of power outages for the second semiconductor chip 14 on the right-hand side of and above the routing structure 16.

Therefore, there is a need for a solution that addresses the aforementioned issues of the prior art.

SUMMARY

In view of the aforementioned shortcomings of the prior art, the present disclosure provides an electronic package, which includes: an encapsulant; a first electronic component embedded in the encapsulant, wherein the first electronic component includes an active surface and a non-active surface opposite to the active surface and side surfaces adjacent to the active surface and the non-active surface, wherein at least one electrode pad is disposed on the active surface, and at least one wire electrically connected with the electrode pad is provided inside the first electronic component; and at least one conductive layer formed on the first electronic component and embedded in the encapsulant and electrically connected with the wire, wherein the conductive layer is free from being formed on the electrode pad.

The present disclosure further provides a method of manufacturing an electronic package, which includes: providing a first electronic component including at least one conductive layer on a surface of the first electronic component, wherein the first electronic component includes an active surface and a non-active surface opposite to the active surface and side surfaces adjacent to the active surface and the non-active surface, wherein at least one electrode pad is disposed on the active surface, and at least one wire electrically connected with the electrode pad is provided inside the first electronic component, such that the conductive layer is electrically connected with the wire, and the conductive layer is free from being formed on the electrode pad; and embedding the first electronic component along with the conductive layer in an encapsulant.

In the aforementioned electronic package and manufacturing method thereof, the electrode pad is positioned in a center of the active surface.

In the aforementioned electronic package and manufacturing method thereof, the wire is exposed from the side surfaces and/or the non-active surface of the first electronic component for contacting the conductive layer.

In the aforementioned electronic package and manufacturing method thereof, the conductive layer is formed on the non-active surface and/or the side surfaces of the first electronic component.

The aforementioned electronic package and manufacturing method thereof further include forming a routing structure on the encapsulant, wherein the routing structure is electrically connected with the electrode pad. For example, the routing structure includes a first surface and a second surface opposite to the first surface, and wherein the encapsulant and the first electronic component are disposed on the first surface, and at least one second electronic component electrically connected with the routing structure is disposed on the second surface. Furthermore, a plurality of second electronic components are disposed on the second surface of the routing structure, such that the first electronic component is electrically bridged between two of the plurality of second electronic components.

The aforementioned electronic package and manufacturing method thereof further include embedding conductive pillars in the encapsulant. For example, a plurality of conductive components are formed on the encapsulant, and the plurality of conductive components are electrically connected with the conductive layer and the conductive pillars.

The aforementioned electronic package and manufacturing method thereof further include forming a plurality of conductive components on the encapsulant, wherein the plurality of conductive components are electrically connected with the conductive layer.

In the aforementioned electronic package and manufacturing method thereof, a plurality of the wires separated and disconnected from one another are provided inside the first electronic component, and a plurality of the conductive layers separated and disconnected from one another are formed on the first electronic component, such that each of the plurality of wires is electrically connected to a different conductive layer.

As can be understood from the above, in the electronic package and the manufacturing method thereof in accordance with the present disclosure, the design of the conductive layers formed on the first electronic component and electrically connected with the wires allows the electrode pads, the wires and the conductive layers to serve as a power transmission structure. Thus, compared to the prior art, in addition to the conductive pillars of the electronic package of the present disclosure acting as current paths, additional current paths are formed by the electrode pads, the wires and the conductive layers, thereby reducing the DC resistance of the electronic package and improving the impedance issue associated with the supply of power.

BRIEF DESCRIPTION OF THE DRAWINGS

FIG. 1-2 is a schematic partial top view of a first semiconductor chip of FIG. 1-1.

FIGS. 2A to 2D and 2E-1 are schematic cross-sectional views illustrating a method of manufacturing an electronic package in accordance with a first embodiment of the present disclosure.

FIG. 2E-2 is a schematic cross-sectional view showing another aspect of FIG. 2E-1.

FIG. 2F-1 is a graph depicting impedance curve (impedance distributions) of an electronic package of the present disclosure and a conventional semiconductor package.

FIG. 2F-2 is a schematic partial top view of a first electronic component of FIG. 2E-1.

DETAILED DESCRIPTION OF THE EMBODIMENTS

Figure 1:
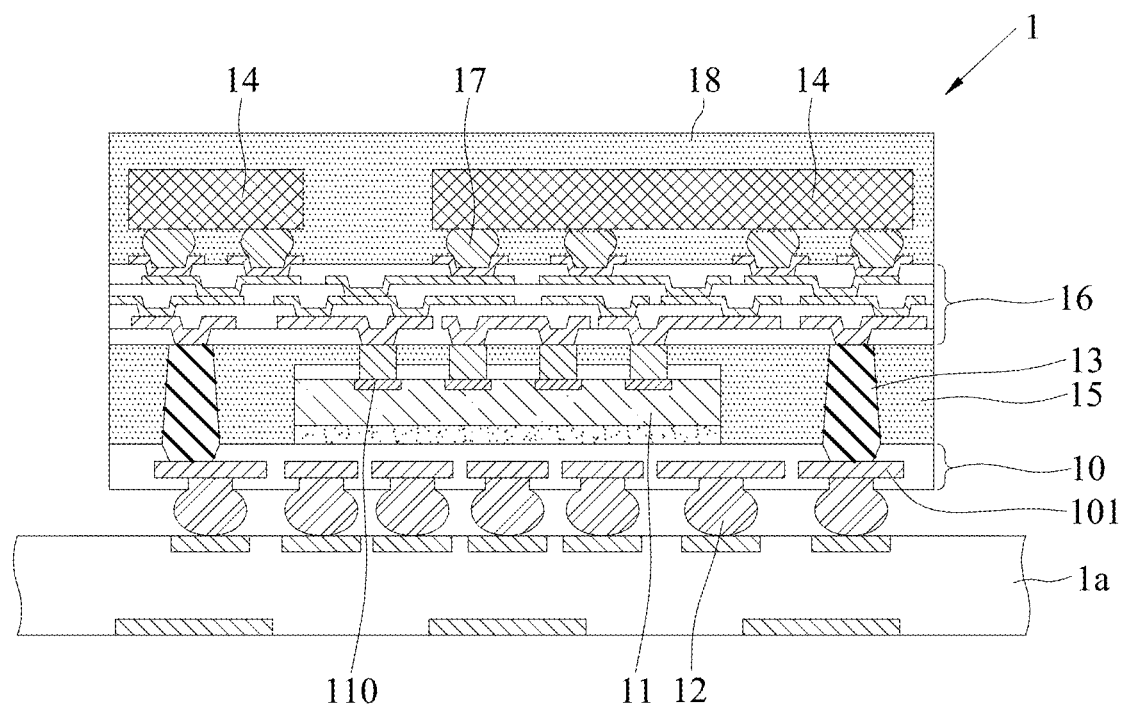
FIG. 1-1 is a schematic cross-sectional view of a conventional semiconductor package.

The implementations of the present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIGS. 2A to 2E-1 are schematic cross-sectional views illustrating a method of manufacturing an electronic package 2 in accordance with a first embodiment of the present disclosure. In an embodiment, the electronic package 2 is manufactured using the Fan-Out Embedded Bridge (FO-EB) technique.

Figure 2A:
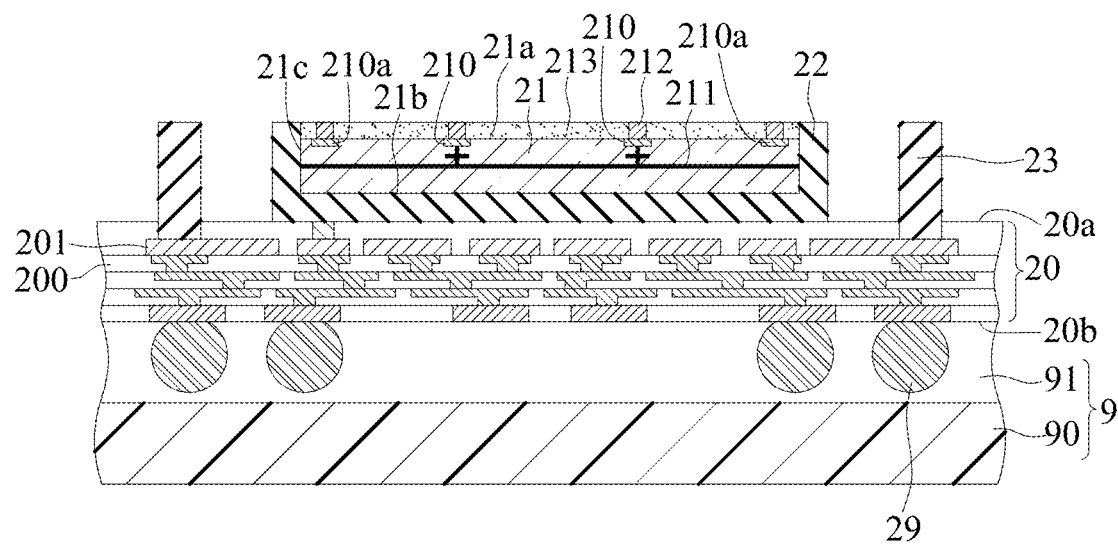

As shown in FIG. 2A, a first electronic component 21 having a conductive layer 22 on a surface of the first electronic component 21 is provided. The first electronic component 21 is then disposed on a carrier structure 20 attached to a carrier 9. The carrier structure 20 includes a first side 20a and a second side 20b opposite to each other. The first electronic component 21 is disposed on the first side 20a of the carrier structure 20. A plurality of conductive pillars 23 (for example, made of a metallic material such as copper or solder material) are disposed on the first side 20a of the carrier structure 20. In addition, in one aspect, the first electronic component 21 having the conductive layer 22 can first be disposed on the first side 20a of the carrier structure 20 before being disposed onto the carrier 9.

In an embodiment, the carrier structure 20 is, for example, a package substrate with a core layer and circuit structure(s), a coreless package substrate with circuit structure(s), a through-silicon interposer (TSI) with through-silicon vias (TSVs), or other types of substrates. The carrier structure 20 includes at least one first dielectric layer 200 and at least one first circuit layer 201 connected with the first dielectric layer 200. The first circuit layer 201 is, for example, a fan-out redistribution layer (RDL). In one example, the material forming the first circuit layer 201 is copper, and the material forming the first dielectric layer 200 is a dielectric material, such as polybenzoxazole (PBO), polyimide (PI), or a prepreg (PP). It can be understood that the carrier structure 20 can also be other types of substrate for carrying a chip, such as a lead frame, a wafer, and other types of boards with metal routings, and the present disclosure is not limited to the above.

Furthermore, the second side 20b of the carrier structure 20 is disposed on the carrier 9 via a plurality of conductive components 29 such as solder balls or other metal bumps (e.g., copper pillars). In an example, the carrier 9 includes a board 90 made of a semiconductor material, a dielectric material, a ceramic material, a glass material or a metallic material, but the present disclosure is not limited thereto. The size of the carrier 9 can be chosen as a wafer form substrate or a panel form substrate depending on the needs. A bonding layer 91, such as a release film or an adhesive, can be formed on the board 90 by coating or bonding. The carrier structure 20 can be laminated onto the bonding layer 91, and the conductive components 29 are embedded into the bonding layer 91.

Moreover, the first electronic component 21 is an active component, a passive component or a combination thereof, wherein the active component is, for example, a semiconductor chip, and a passive component is, for example, a resistor, a capacitor or an inductor. In an embodiment, the first electronic component 21 is a semiconductor chip having an active surface 21a, a non-active surface 21b opposite to the active surface 21a, and side surfaces 21c adjacent to the active surface 21a and the non-active surface 21b. The first electronic component 21 is disposed on the first side 20a of the carrier structure 20 via the non-active surface 21b of the first electronic component 21, and at least one electrode pad 210 (which serves as a power pin port and can be located in the center of the active surface 21a) and a plurality of contacts 210a (which serve as signal pin port and can be located arbitrarily on the active surface 21a, such as on the periphery or the center) are disposed on the active surface 21a. At least one wire 211 electrically connected to the electrode pad 210 and a plurality of integrated circuits (not shown) electrically connected to the contacts 210a are provided inside the first electronic component 21. The wire 211 is exposed from the side surfaces 21c (as shown in FIG. 2A) or the non-active surface 21b (such as a wire 411 shown in FIG. 2E-2) of the first electronic component 21. In an example, conductors 212 (in the shapes of pillars, pins or other types of bumps) can be formed on the electrode pad 210 and the contacts 210a, and an insulating protective film 213 is formed on the active surface 21a in such a way that the conductors 212 are exposed from the insulating protective film 213.

In addition, the conductive layer 22 is formed on the non-active surface 21b and the side surfaces 21c of the first electronic component 21, so that the first electronic component 21 is disposed on the first side 20a of the carrier structure 20 via the conductive layer 22, and the conductive layer 22 is electrically connected to the first circuit layer 201, such that the conductive layer 22 and the wire 211 act as a power transmission structure. For example, the material forming the conductive layer 22 can be copper with a plating thickness of about 5 μm. It can be understood that when the wire 411 is exposed from the non-active surface 21b of the first electronic component 21, a conductive layer 42 can be formed only on the non-active surface 21b of the first electronic component 21 (as shown in FIG. 2E-2).

Figure 2B:
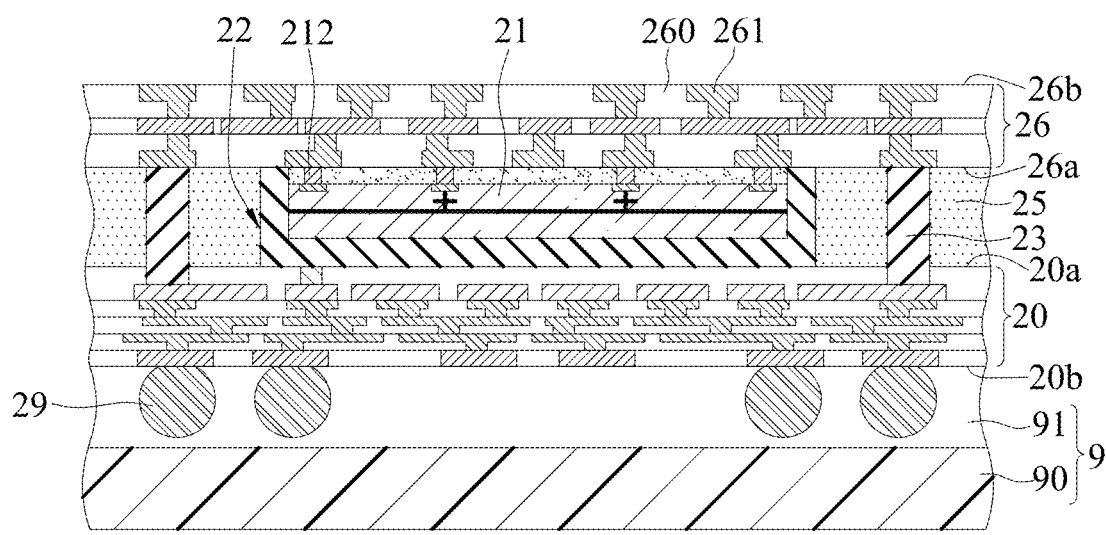

As shown in FIG. 2B, an encapsulant 25 is formed on the first side 20a of the carrier structure 20, such that the encapsulant 25 covers the first electronic component 21, the conductive layer 22 and the conductive pillars 23. Next, a routing structure 26 is formed on the encapsulant 25, such that the routing structure 26 is electrically connected with the conductive pillars 23 and the conductors 212.

In an embodiment, the material forming the encapsulant 25 is an insulating material, such as PI, a dry film, epoxy resin, or a molding compound, but the present disclosure is not limited as such. In an example, the encapsulant 25 can be laminated or molded on the first side 20a of the carrier structure 20.

Furthermore, a planarization process can be performed as needed to allow the upper surface of the encapsulant 25 to be flush with the end faces of the conductive pillars 23, the surface of the insulating protective film 213 and the top faces of the conductors 212, so that the end faces of the conductive pillars 23, the surface of the insulating protective film 213 and the top faces of the conductors 212 are exposed from the encapsulant 25. For example, the planarization process can be carried out by polishing to remove part of the conductive pillars 23, part of the insulating protective film 213, part of the conductors 212 and part of the encapsulant 25.

Moreover, the routing structure 26 includes a first surface 26a and a second surface 26b opposite to each other. The routing structure 26 is bonded to the encapsulant 25 via the first surface 26a of the routing structure 26, such that the first electronic component 21 and the conductive pillars 23 are disposed on the first surface 26a.

In addition, the routing structure 26 includes at least one second dielectric layer 260 and a plurality of second circuit layers 261 (e.g., RDLs) disposed on the second dielectric layer 260. The second circuit layers 261 of the routing structure 26 are electrically connected to the conductive pillars 23 as well as the electrode pads 210 and the contacts 210a through the conductors 212. In an example, the material forming the second circuit layer 261 is copper, and the material forming the second dielectric layer 260 is a dielectric material, such as PBO, PI, or a PP.

Figure 2C:
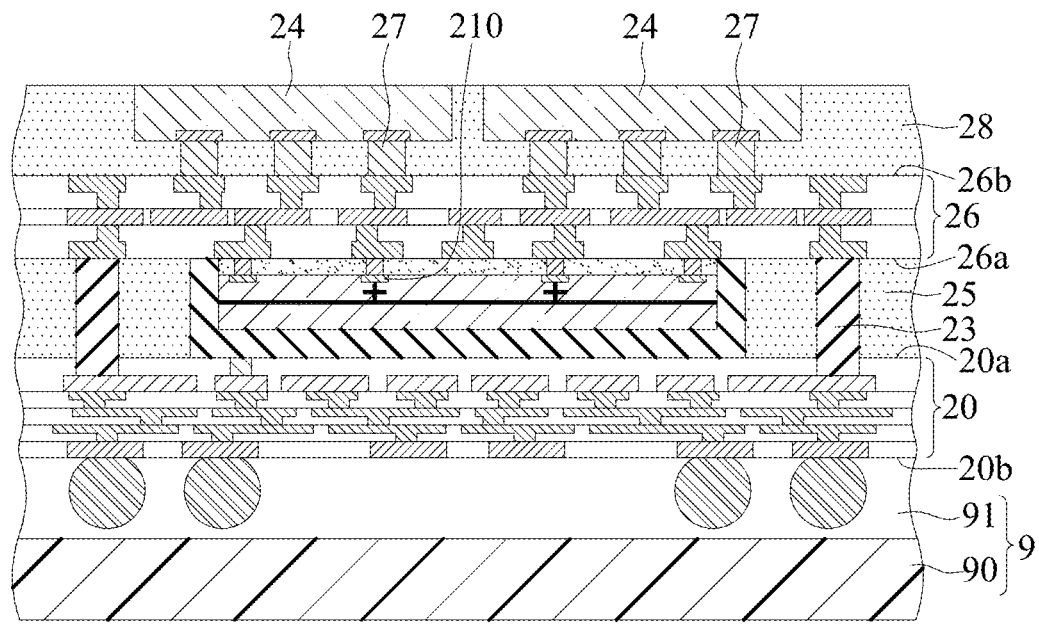

As shown in FIG. 2C, a plurality of second electronic components 24 are disposed on the second surface 26b of the routing structure 26, and an encapsulation layer 28 is then formed to encapsulate the second electronic components 24.

In an embodiment, the second electronic components 24 are active components, passive components or a combination thereof, and the active components can be, for example, semiconductor chips, and passive components can be, for example, resistors, capacitors or inductors. In an example, the second electronic components 24 are electrically connected to the second circuit layers 261 of the routing structure 26 in a flip-chip manner via a plurality of conductive bumps 27 (e.g., solder bumps, copper bumps, or other types of bumps). As a result, the first electronic component 21 becomes a bridge component embedded in the encapsulant 25 and is electrically bridged between adjacent second electronic components 24 via the electrode pads 210. However, there are numerous ways in which the second electronic components 24 can be connected with the routing structure 26, such as wire bonding, and the present disclosure is not limited to the above.

Furthermore, the encapsulation layer 28 can encapsulate the second electronic components 24 and the conductive bumps 27 at the same time. Alternatively, an underfill (not shown) can first be formed between the second electronic components 24 and the second surface 26b of the routing structure 26 to cover the conductive bumps 27, and then the encapsulation layer 28 is formed to cover the underfill and the second electronic components 24.

Moreover, the encapsulation layer 28 is an insulating material, such as PI, a dry film, or an encapsulant or molding compound such as epoxy resin. The encapsulation layer 28 can be laminated or molded on the routing structure 26. It can be understood that the material forming the encapsulation layer 28 can be the same as or different from that forming the encapsulant 25.

In addition, the encapsulation layer 28 can cover the backsides (not shown) of the second electronic components 24 or expose the backsides of the second electronic components 24 (as shown in FIG. 2C).

Figure 2D:
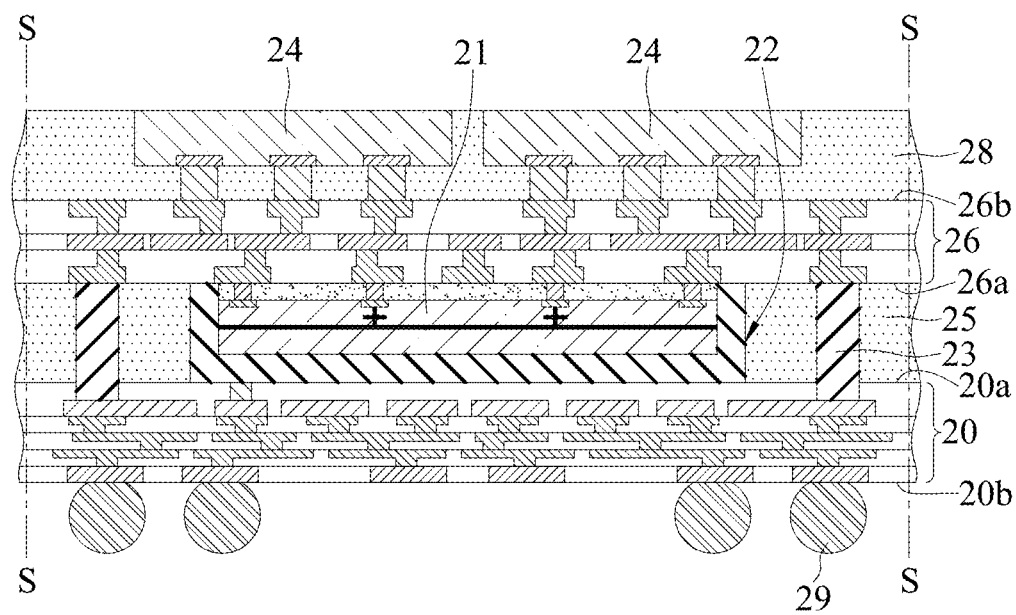
Figures 1, 2E:
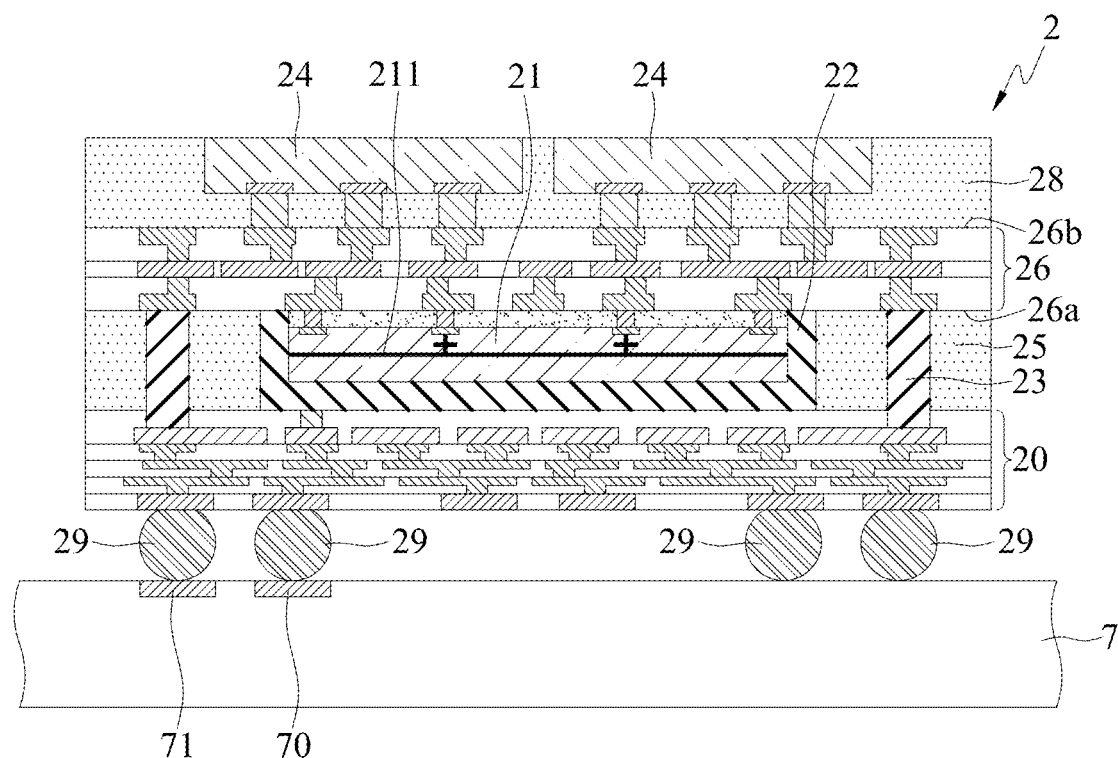
Figures 2, 2E:
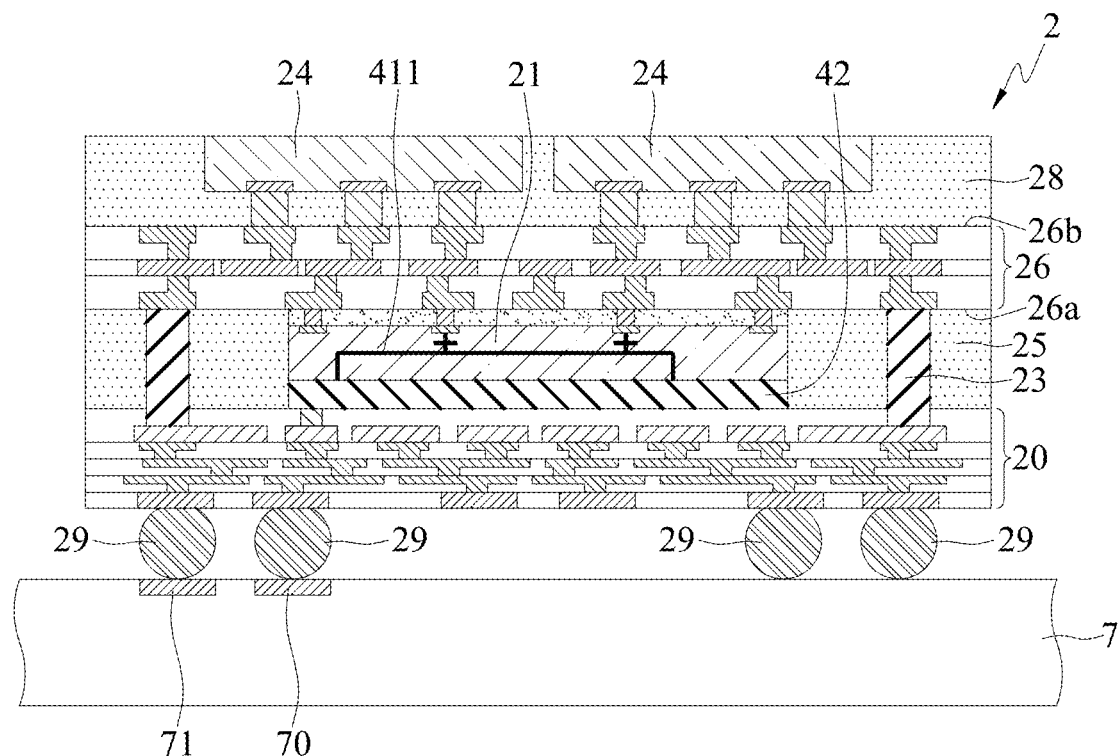

As shown in FIG. 2D, the carrier 9 and the bonding layer 91 thereon are removed to expose the plurality of conductive components 29.

Figures 1, 2:
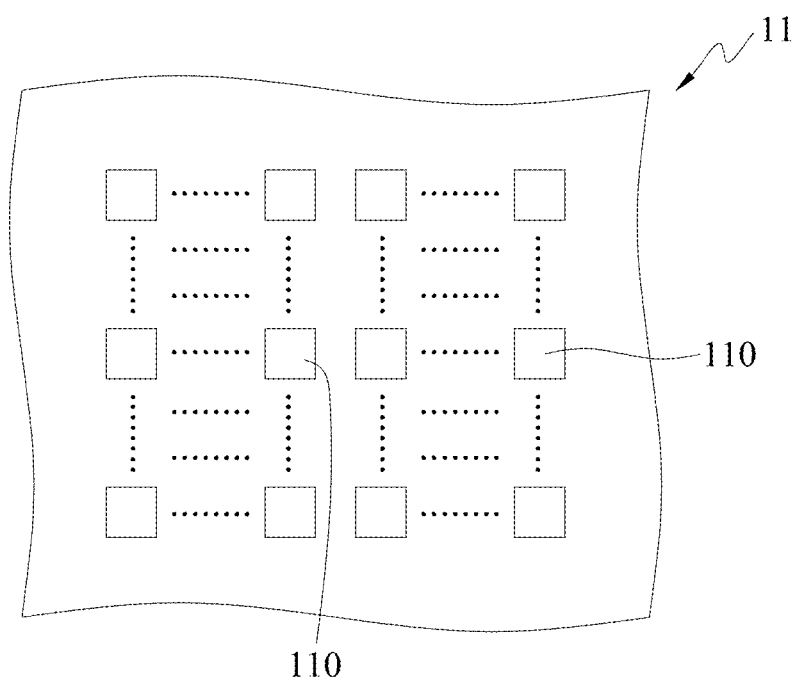

As shown in FIG. 2E-1, a singulation process is performed along cutting paths S shown in FIG. 2D to obtain a plurality of electronic packages 2, so that in the subsequent process each of the electronic packages 2 can be disposed onto an electronic device 7 (e.g., a circuit board) via the respective conductive components 29.

In an embodiment, some of the conductive components 29 of the electronic package 2 (e.g., the conductive components 29 shown on the left-hand side of FIG. 2E-1) are correspondingly connected to power supply ports 70, 71 of the electronic device 7. In an example, the power supply port 70 is electrically connected to the conductive layer 22, while the other power supply port 71 is electrically connected to the conductive pillar 23. It can be understood that other conductive components 29 of the electronic package 2 (e.g., the conductive components 29 shown on the right-hand side of FIG. 2E-1) are correspondingly connected to signal contacts (not shown) of the electronic device 7.

Therefore, in the electronic package 2 in accordance with the present disclosure, the design of an electrode pad 210, a wire 211, 411 and a conductive layer 22, 42 included in the first electronic component 21 allows the electrode pad 210, the wire 211, 411 and the conductive layer 22, 42 to serve as a power transmission structure. Thus, compared to the prior art, in addition to the conductive pillars 23 of the electronic package 2 of the present disclosure acting as current paths, an additional current path is formed by the electrode pad 210, the wire 211, 411 and the conductive layer 22, 42, thereby reducing the DC resistance of the electronic package 2 and improving the impedance issue associated with the supply of power.

Figures 1, 2F:
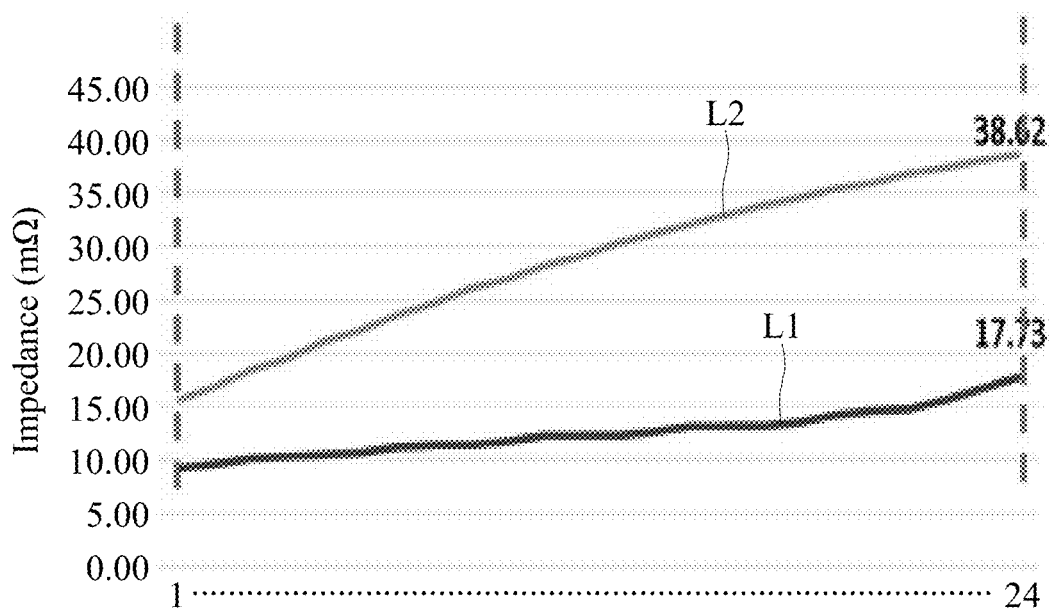
Figures 2, 2F:
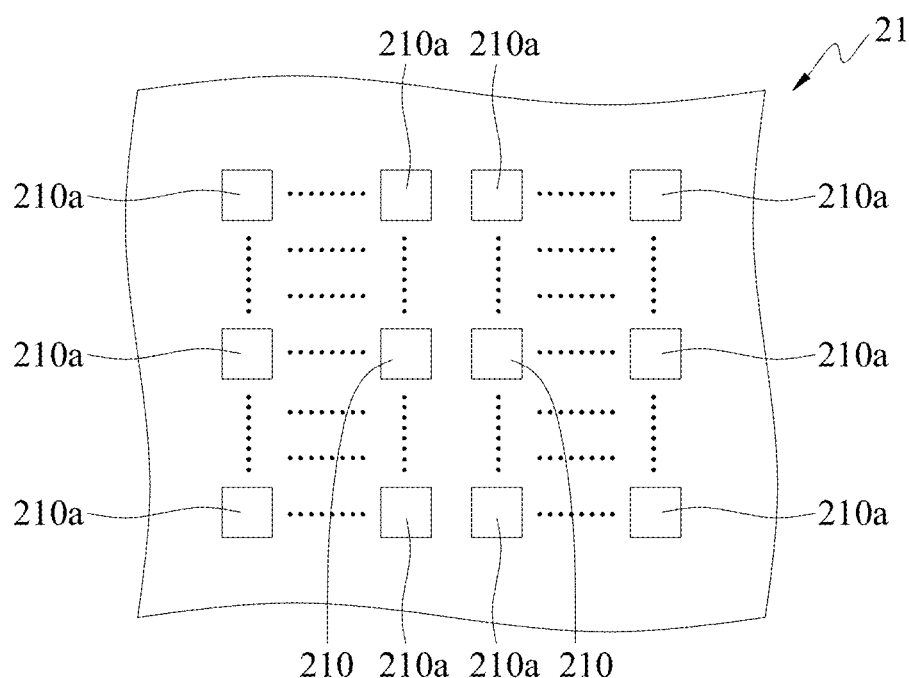

For example, in the distribution of the contacts 110 in the conventional first semiconductor chip 11 shown in FIG. 1-2, a contact 110 near the center (denoted as numeral 24 on the horizontal axis in FIG. 2F-1) has a very large DC resistance (with an impedance value of 38.62 milliohms on an impedance curve L2 in FIG. 2F-1). On the other hand, in the distribution of pin port of the first electronic component 21 in accordance with the present disclosure shown in FIG. 2F-2, an electrode pad 210 near the center (denoted as numeral 24 on the horizontal axis in FIG. 2F-1) has a reduced DC resistance (with an impedance value of 17.73 milliohms on an impedance curve L1 in FIG. 2F-1), wherein the vertical axis in FIG. 2F-1 represents impedance in inductor (DCR) generated by a working voltage (VDD) in a device, and the horizontal axis represents distribution of pin port on the active surface of a chip (with numeral 1 denoting a pin port at the periphery [such as the contact 110, 210a], and numeral 24 denoting a pin port in the center [such as the contact 110 or the electrode pad 210]).

Therefore, as can be seen from FIG. 2F-1, by adding a new power supply loop (i.e., the current path formed by the electrode pad 210, the wire 211, 411 and the conductive layer 22, 42) in the electronic package 2 of the present disclosure, the DCR of the FO-EB package can be greatly reduced (the impedance curve L1 for the electronic package 2 of the present disclosure is much lower than the impedance curve L2 of the conventional semiconductor package 1, in other words, by plating the surface of the first electronic component 21 with a conductive layer 22, 42 to a thickness of about 5 μm, the DCR can be reduced by 54%), the power supply issue of the FO-EB electronic package 2 can be effectively addressed.

Moreover, since the electrode pad 210, the wire 211, 411 and the conductive layer 22, 42 can be used as current path, the manufacturing of the conductive pillars 23 can be omitted depending on power demands (or simply manufacture conductive pillars for other functions not for power supply use).

In addition, there are numerous processing steps for FO-EB, and the present disclosure is not limited to the above. For example, conductive pillars 23 and a first electronic component 21 having a conductive layer 22, 42 can first be disposed on a carrier 9, after the processes shown in FIGS. 2B to 2D have been implemented, the carrier 9 is removed before forming a carrier structure 20 and conductive components 29. Alternatively, the carrier structure 20 can be omitted and conductive components 29 in electrical connections with the conductive pillars 23 and the conductive layer 22, 42 can be directly formed. As such, the electronic package 2 of the present disclosure can include or omit the carrier structure 20 depending on the needs.

FIGS. 3A to 3D are schematic cross-sectional views illustrating a method of manufacturing an electronic module 3 (i.e., the first electronic component 21 with the conductive layer 22) of the electronic package 2 in accordance with the present disclosure.

Figure 3A:
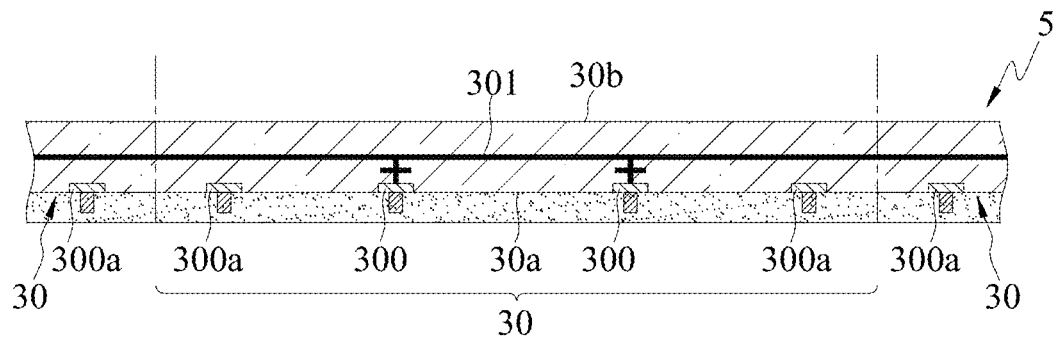
FIGS. 3A to 3D are schematic cross-sectional views illustrating a method of manufacturing an electronic module of an electronic package in accordance with the present disclosure.
Figure 3B:
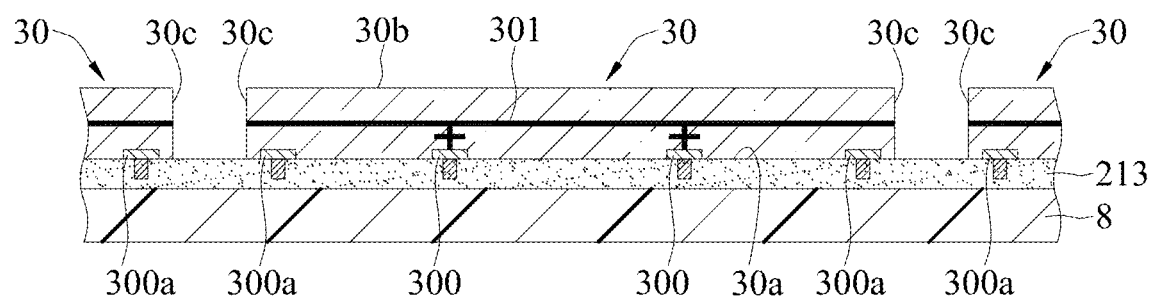

As shown in FIGS. 3A and 3B, a wafer 5 is singulated to obtain a plurality of first electronic components 30. Then, the plurality of first electronic components 30 are arranged at intervals on a panel form carrier 8.

In an embodiment, the first electronic component 30 includes an active surface 30a and a non-active surface 30b opposite to each other. The active surface 30a includes a plurality of electrode pads 300 and a plurality of contacts 300a, and a plurality of wires 301 electrically connected with the electrode pads 300 are provided inside the first electronic component 30. The first electronic component 30 is attached onto the carrier 8 via the active surface 30a. For example, conductors 212 are formed on the electrode pads 300 and the contacts 300a, and an insulating protective film 213 is formed on the active surface 30a of the wafer 5 to cover the conductors 212, such that the wafer 5 is attached onto the carrier 8 through the insulating protective film 213.

Moreover, after singulation of the wafer 5, the wires 301 are exposed from side surfaces 30c of the first electronic component 30. It can be understood that the wires 301 can also be exposed from the non-active surface 30b of the first electronic component 30.

Figure 3C:
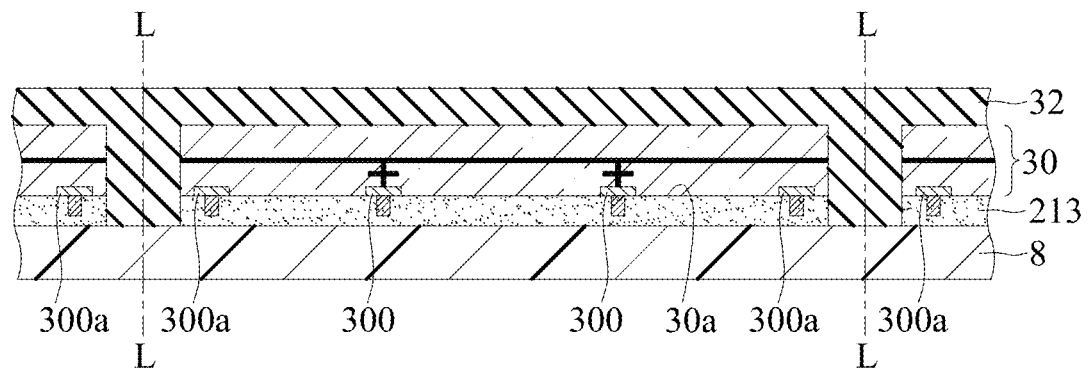

As shown in FIG. 3C, a conductive layer 32 is formed on the non-active surface 30b and the side surfaces 30c of the first electronic component 30, such that the conductive layer 32 covers the first electronic component 30.

In an embodiment, the conductive layer 32 is coated on the entire or a portion of the non-active surface 30b and/or the entire or a portion of the side surfaces 30c of the first electronic component 30 by electroplating, deposition or other methods.

Moreover, the conductive layer 32 is in contact with the wires 301 so as to be electrically connected with the electrode pads 300 via the wires 301. The conductive layer 32 is free from being electrically connected with the contacts 300*a*. For example, the conductive layer 32 and the wires 301 serve as a power transmission structure.

Figure 3D:
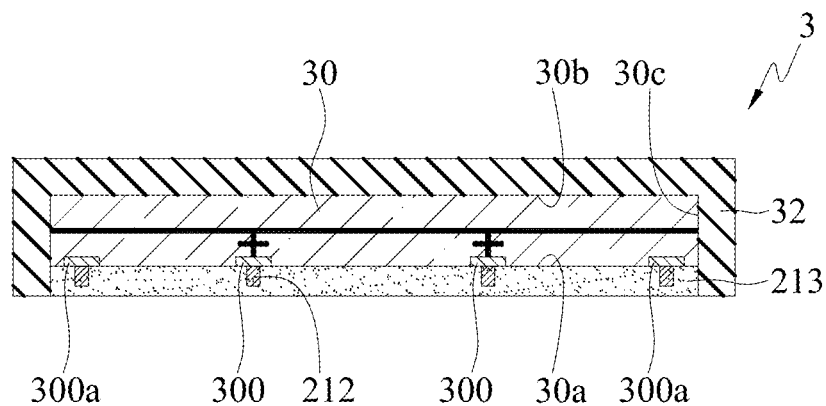

As shown in FIG. 3D, a singulation process is performed along cutting paths L shown in FIG. 3C, and then the carrier 8 is removed to obtain a plurality of electronic modules 3, wherein the conductive layer 32 is free from being formed on the active surface 30*a* of the first electronic component 30.

In an embodiment, the electronic module 3 is applied to the electronic package 2 shown in FIG. 2E-1. Some of the conductive pillars 23 are used as one power transmission path, and the first electronic component 30 provides another power transmission path (i.e., the conductive layer 32, the wire 301 and the electrode pads 300). As such, the first electronic component 30 can be used as a bridge chip between at least two second electronic components 24 and provides the power needed by these second electronic components 24.

Figure 4A:
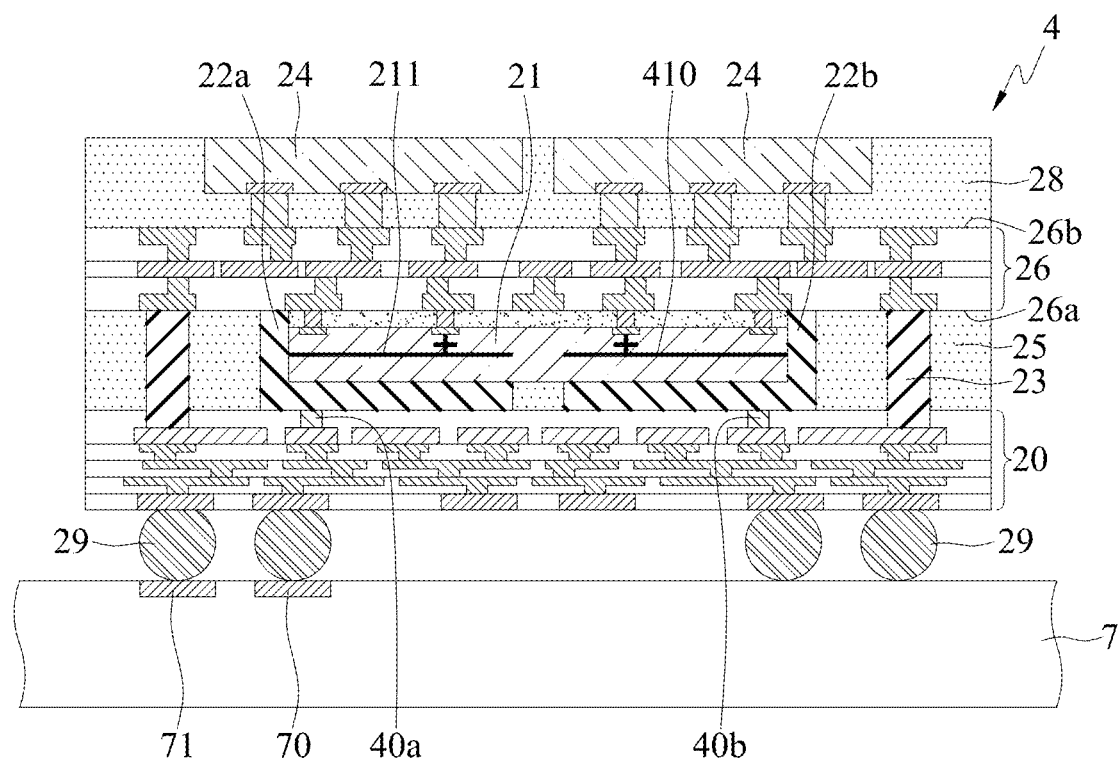
FIGS. 4A and 4B are schematic cross-sectional views depicting an electronic package in accordance with a second embodiment of the present disclosure.
Figure 4B:
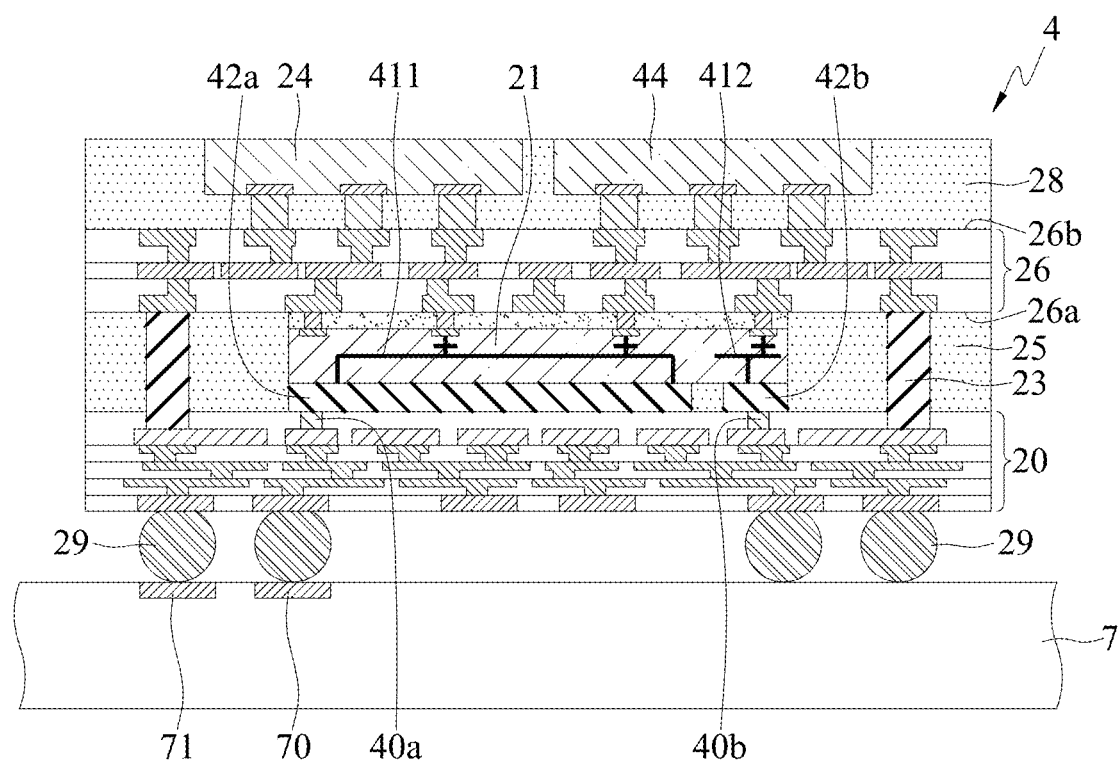

FIGS. 4A and 4B are schematic cross-sectional views depicting an electronic package 4 in accordance with a second embodiment of the present disclosure. The difference between this embodiment and the first embodiment is in that the electronic package 4 is provided with multiple sets of power transmission structures, and similarities between the two will not be repeated.

As shown in FIG. 4A, the first electronic component 21 has two sets of power transmission structures, which include two wires 211 and 410 separate and not connected to each other, so that each of the wires 211 and 410 can be electrically connected to a different second electronic component 24. The wires 211 and 410 are electrically connected to a first conductive layer 22*a* and a second conductive layer 22*b*, respectively, wherein the first conductive layer 22*a* and the second conductive layer 22*b* are formed on the side surfaces 21*c* and the non-active surface 21*b* of the first electronic component 21 and are separate and disconnected from each other.

In an embodiment, the first circuit layer 201 includes a first connector 40*a* and a second connector 40*b* for electrically connecting with the first conductive layer 22*a* and the second conductive layer 22*b*, respectively. In an example, the first and second connectors 40*a* and 40*b* can be in the shape of pads, pillars, or other appropriate shapes, and the present disclosure is not limited as such.

Moreover, in the two sets of power transmission structures, as shown in FIG. 4B, a wire 411 (electrically connected to a first conductive layer 42*a*) can be electrically connected to different second electrical components 24 and 44, while another wire 412 (electrically connected to a second conductive layer 42*b*) can be electrically connected to a single second electrical component 44. As such, two sets of power transmission structures (i.e., the two wires 411 and 412) can both provide power required by the same second electrical component 44, wherein the first conductive layer 42*a* and the second conductive layer 42*b* are formed on the non-active surface 21*b* of the first electronic component 21, and the first connector 40*a* is electrically connected to the first conductive layer 42*a*, while the second connector 40*b* is electrically connected to the second conductive layer 42*b*.

The present disclosure further provides an electronic package 2, which includes an encapsulant 25, a first electronic component 21 embedded in the encapsulant 25 and at least one conductive layer 22, 42 formed on the first electronic component 21.

The first electronic component 21 includes an active surface 21*a* and a non-active surface 21*b* opposite to each other and side surfaces 21*c* adjacent to the active surface 21*a* and the non-active surface 21*b*. At least one electrode pad 210 is disposed on the active surface 21*a*, and at least one wire 211, 411 electrically connected with the electrode pad 210 is provided inside the first electronic component 21.

The conductive layer 22, 42 is embedded in the encapsulant 25 and electrically connected with the wire 211, 411, wherein the conductive layer 22, 42 is free from being formed on the electrode pad 210.

In an embodiment, the electrode pad 210 is positioned in the center of the active surface 21*a*.

In an embodiment, the wire 211, 411 is exposed from the side surfaces 21*c* and/or the non-active surface 21*b* of the first electronic component 21 for contacting the conductive layer 22, 42.

In an embodiment, the conductive layer 22, 42 is formed on the non-active surface 21*b* and/or the side surfaces 21*c* of the first electronic component 21.

In an embodiment, the electronic package 2 further includes a routing structure 26 formed on the encapsulant 25 and electrically connected with the electrode pad 210. For example, the routing structure 26 includes a first surface 26*a* and a second surface 26*b* opposite to each other, wherein the encapsulant 25 and the first electronic component 21 are provided on the first surface 26*a*, and at least one second electronic component 24, 44 electrically connected with the routing structure 26 is provided on the second surface 26*b*. Furthermore, a plurality of second electronic components 24, 44 are provided on the second surface 26*b* of the routing structure 26, so that the first electronic component 21 is electrically bridged between two of the plurality of second electronic components 24, 44.

In an embodiment, the electronic package 2 further includes conductive pillars 23 embedded in the encapsulant 25, and the electronic package 2 further includes conductive components 29 formed on the encapsulant 25 and electrically connected with the conductive layer 22 and the conductive pillars 23.

In an embodiment, the electronic package 2 further includes conductive components 29 formed on the encapsulant 25 and electrically connected with the conductive layer 22.

In an embodiment, a plurality of wires 211, 410, 411, 412 separate and disconnected from one another are provided inside the first electronic component 21, and a plurality of first conductive layer 22*a*, 42*a* and second conductive layer 22*b*, 42*b* separate and disconnected from each other are formed on the first electronic component 21, so that the plurality of wires 211, 410, 411, 412 are electrically connected to the respective first conductive layer 22*a*, 42*a* and second conductive layer 22*b*, 42*b*.

In summary, the electronic package and the manufacturing method thereof in accordance with the present disclosure allows electrode pads, wires and conductive layers to be used as power transmission structure by forming the electrode pads, the wires and the conductive layers on the first electronic component. As a result, in the electronic package of the present disclosure, in addition to the conductive pillars providing a current path, the electrode pads, the wires and the conductive layers provide additional current path to reduce the DC resistance of the electronic package, thereby improving the impedance issue associated with the supply of power.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A method of manufacturing an electronic package, comprising:
   providing a first electronic component including at least one conductive layer on a surface of the first electronic component, wherein the first electronic component includes an active surface and a non-active surface opposite to the active surface and side surfaces adjacent to the active surface and the non-active surface, wherein at least one electrode pad is disposed on the active surface, and at least one wire electrically connected with the electrode pad is provided inside the first electronic component, such that the conductive layer is electrically connected with the wire; and
   embedding the first electronic component along with the conductive layer in an encapsulant.

2. The method of claim 1, wherein the electrode pad is positioned in a center of the active surface.

3. The method of claim 1, wherein the wire is exposed from at least one of the side surfaces and the non-active surface of the first electronic component for contacting the conductive layer.

4. The method of claim 1, wherein the conductive layer is formed on at least one of the non-active surface and the side surfaces of the first electronic component and is free from being formed on the electrode pad.

5. The method of claim 1, further comprising forming a routing structure on the encapsulant, wherein the routing structure is electrically connected with the electrode pad.

6. The method of claim 5, wherein the routing structure includes a first surface and a second surface opposite to the first surface, wherein the encapsulant and the first electronic component are disposed on the first surface, and at least one second electronic component electrically connected with the routing structure is disposed on the second surface, and wherein a plurality of second electronic components are disposed on the second surface of the routing structure, such that the first electronic component is electrically bridged between two of the plurality of second electronic components.

7. The method of claim 1, further comprising embedding conductive pillars in the encapsulant.

8. The method of claim 7, further comprising forming a plurality of conductive components on the encapsulant, wherein the plurality of conductive components are electrically connected with the conductive layer and the conductive pillars.

9. The method of claim 7, further comprising forming a plurality of conductive components on the encapsulant, wherein the plurality of conductive components are electrically connected with the conductive layer.

10. The method of claim 1, wherein a plurality of the wires separated and disconnected from one another are provided inside the first electronic component, and a plurality of the conductive layers separated and disconnected from one another are formed on the first electronic component, such that each of the plurality of wires is electrically connected to a different conductive layer.

* * * * *